(12) United States Patent
Cesaretti et al.

(10) Patent No.: US 10,608,168 B2
(45) Date of Patent: Mar. 31, 2020

(54) ISOLATED HALL EFFECT ELEMENT WITH IMPROVED ELECTRO-MAGNETIC ISOLATION

(71) Applicant: Allegro MicroSystems, LLC, Manchester, MA (US)

(72) Inventors: Juan Manuel Cesaretti, Ciudad de Buenos Aires (AR); Gerardo A. Monreal, Buenos Aires (AR); Daniel Musciano, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/724,576

(22) Filed: Oct. 4, 2017

(65) Prior Publication Data

US 2019/0103551 A1 Apr. 4, 2019

(51) Int. Cl.
*H01L 43/06* (2006.01)
*H01L 43/14* (2006.01)
*H01L 43/04* (2006.01)

(52) U.S. Cl.
CPC ............ *H01L 43/065* (2013.01); *H01L 43/06* (2013.01); *H01L 43/04* (2013.01); *H01L 43/14* (2013.01)

(58) Field of Classification Search
CPC .............................. H01L 43/06; H01L 43/065
USPC .......... 257/421, E43.002, E43.003, E43.007; 438/48
See application file for complete search history.

(56) References Cited

U.S. PATENT DOCUMENTS

| 8,357,983 | B1 | 1/2013 | Wang | |
|---|---|---|---|---|
| 2007/0170537 | A1* | 7/2007 | Poenar | H01L 31/1884 257/462 |
| 2012/0139079 | A1* | 6/2012 | Tokura | H01L 21/76283 257/471 |

OTHER PUBLICATIONS

Wikipedia "Hall effect sensor" printed on Apr. 6, 2019, https://en.wikipedia.org/w/index.php?title=Hall_effect_sensor&oldid=891177115; 6 pages.

* cited by examiner

*Primary Examiner* — Robert T Huber
(74) *Attorney, Agent, or Firm* — Daly, Crowley, Mofford & Durkee, LLP (57) ABSTRACT

A planar Hall effect element be formed upon or can include a P-type substrate. The planar Hall effect element can also include a Hall plate region. The Hall plate region can include a first portion of an N-type layer disposed over the P-type substrate. The first portion of the N-type layer can include a top surface distal from the P-type substrate, and a continuous N-type outer boundary intersecting the top surface of the Hall plate region. The planar Hall effect element can also include an isolation region having a continuous outer boundary and having a continuous inner boundary, the continuous inner boundary in contact with all of the outer boundary of the Hall plate region, the P-type substrate and the first portion of the N-type layer not forming a P/N junction.

34 Claims, 5 Drawing Sheets

ISOLATED HALL EFFECT ELEMENT WITH IMPROVED ELECTRO-MAGNETIC ISOLATION

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensing elements and, more particularly, to a substrate isolated Hall effect element.

BACKGROUND

Both vertical and planar (or horizontal) Hall effect elements are known types of semiconductor elements that can be used to sense and external magnetic field. The vertical and the planar Hall effect elements have different semiconductor structures.

A vertical Hall effect element has an axis of maximum sensitivity parallel to a major surface of a substrate upon which the vertical Hall elements is formed. In contrast, a planar Hall effect element has an axis of maximum sensitivity perpendicular to a major surface of a substrate upon which the planar Hall elements is formed.

A conventional planar Hall effect element is a four terminal device, the four terminals coupled to a Hall plate. The Hall effect element can also include a field plate disposed over the Hall plate. Two of the terminals can be configured to pass a current between the two terminals and the other two terminals can provide a voltage in response to a magnetic field. The Hall plate can be comprised of a first portion of an N-type epitaxial layer disposed over a P-type substrate. The field plate can he comprised of a portion of a metal layer disposed over the Hall plate.

From the description above, it should be apparent that there can be a P/N junction (a diode) from the P-type substrate to another portion of the N-type epitaxial layer, for example, the another portion of the N-type epitaxial layer of an output circuit. The P/N junction can be subject to undesirable minority carrier charge flowing from the P-type substrate into the another portion of the N-type epitaxial layer when there is a sufficient voltage (e.g., 0.7 volts) between the P-type substrate and the N-type epitaxial layer. The sufficient voltage could be generated as a result of external electro-magnetic interference (EMI), for example, radio waves.

In the presence of the above minority carrier flow, the Hall plate formed with the first portion of the N-type epitaxial layer can act as a collector of a transistor. Other portions of the N-type epitaxial layer can also act as collectors, but the first portion of the N-type epitaxial layer of the Hall plate may be particularly susceptible. Thus, the minority carrier charge flow can cause unintended and undesirable effects on the function of the circuit, e.g., magnetic field sensor, when exposed to EMI.

It would be desirable have a planar Hall effect element for which charge is not able to flow the from the P-type substrate to the N-type Hall plate when the circuit, e.g., magnetic field sensor, is subject to EMI.

SUMMARY

The present invention provides a planar Hall effect element for which charge is not able to flow the from a P-type substrate to the N-type Hall plate when the circuit, e.g., magnetic field sensor, is subject to EMI.

In accordance with an example useful for understanding an aspect of the present invention, a planar Hall effect element can be formed upon or can include a P-type substrate. The Hall effect element can further include a Hall plate region. The Hall plate region can include a first portion of an N-type layer disposed above the P-type substrate, the first portion of the N-type layer comprising: a top surface distal from the P-type substrate; and a continuous N-type outer boundary intersecting the top surface of the Hall plate region. The planar Hall effect element can further include an isolation region having a continuous outer boundary and having a continuous inner boundary, the continuous inner boundary in contact with all of the outer boundary of the Hall plate region, the P-type substrate and the first portion of the N-type layer not forming a P/N junction.

In accordance with another example useful for understanding another aspect of the present invention, a method of forming a planar Hall effect element can include providing a P-type substrate. The method can further include forming a Hall plate region. The forming the Hall plate region can include forming a first portion of an N-type layer disposed above the P-type region. The first portion of the N-type layer can include a top surface distal from the P-type substrate, and a continuous N-type outer boundary intersecting the top surface of the Hall plate region. The method can further include forming an isolation region having a continuous outer boundary and having a continuous inner boundary, the continuous inner boundary in contact with all of the outer boundary of the Hall plate region, the P-type substrate and the first portion of the N-type layer not forming a P/N junction.

In accordance with another example useful for understanding another aspect of the present invention, a planar Hall element can be formed upon or can include a P-type substrate. The planar Hall effect element can further include means for forming a Hall plate region. The means for forming the Hall plate region can include means for forming a first portion of an N-type layer disposed above the P-type substrate. The first portion of the N-type layer can include a top surface distal from the P-type substrate, and a continuous N-type outer boundary intersecting the top surface of the Hall plate region. The planar Hall effect element can further include means for forming an isolation region having a continuous outer boundary and having a continuous inner boundary, the continuous inner boundary in contact with all of the outer boundary of the Hall plate region, the P-type substrate and the first portion of the N-type layer not forming a P/N junction.

BRIEF DESCRIPTION OF THE DRAWINGS

The foregoing features of the invention, as well as the invention itself may be more fully understood from the following detailed description of the drawings, in which.

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "substrate" is used to describe any type of structure with a flat surface upon which semiconductor materials can be deposited and/or into which semiconductor materials can be implanted and diffused. In some embodiments, the substrate is a P-type silicon semiconductor substrate having a particular range of concentrations of P-type atoms (i.e., ions)

As used herein, the term "epi" is used to refer to an epitaxial layer, for example, an N-type epitaxial layer, disposed over a substrate, for example, a P-type substrate, and having a particular range of concentrations of N-type atoms (i.e. ions).

As used herein, the term "P-well" is used to refer to a region implanted and diffused into a semiconductor layer, for example, into a surface of the epitaxial layer further from the substrate, and having a particular range of concentrations of P-type atoms (i.e. ions).

As used herein, the term "P-type buried layer" or simply "PBL" is used to refer to a region implanted and diffused into a semiconductor layer, for example, implanted into the substrate and then upwardly diffused into the epitaxial (epi) layer (also referred to herein as an epi layer). The epi layer can be grown after PBL implant and diffusion steps, and the upward diffusion into epi layer can be performed during a field oxidation process.

As used herein, the term "N-type buried layer" or simply "NBL" is used to refer to a region implanted and diffused into a semiconductor layer, for example, implanted into the substrate and then upwardly diffused into the epitaxial (epi) layer. The epi layer can be grown after NBL implant and diffusion steps, and the upward diffusion into epi layer can be performed during a field oxidation process.

As used herein, the concentrations of the above types of semiconductor structures can fall into the following ranges:
substrate=about $1 \times 10^{15}$ P-type atoms per $cm^3$, for example, boron atoms.
epi=about $1 \times 10^{15}$ to about $6 \times 10^{15}$ N-type atoms per $cm^3$, for example, Arsenic atoms,
  where: $5 \times 10^{14}$ to $1 \times 10^{15}$ can be representative of a concentration of epi bulk doping, and $5 \times 10^{15}$ to $1 \times 10^{16}$ can be representative of a concentration at a surface region of the epi layer at about 2 um depth created by an additional epi implant step. (Alternatively, $1 \times 10^{15}$ to $6 \times 10^{15}$).
N+=about $1 \times 10^{20}$ N-type atoms per $cm^3$, for example, phosphorous atoms.
LN=about 1 to $2 \times 10^{17}$ atoms per $cm^3$, for example, phosphorous atoms.
P-well=about $1 \times 10^{16}$ P-type atoms per $cm^3$, for example, boron atoms.
PBL=about $1 \times 10^{18}$ to about $2 \times 10^{18}$ P-type atoms per $cm^3$, for example, boron atoms.
NBL=about $1 \times 10^{19}$ to about $1.5 \times 10^{19}$ N-type atoms per $cm^3$, for example, antimony atoms.
P+=about $3 \times 10^{19}$ to about $5 \times 10^{19}$ P-type atoms per $cm^3$, for example, boron atoms.

In some embodiments, the concentrations are outside of the above ranges or values, but within about +/−twenty percent of the above ranges or values.

It should be noted that reference is sometimes made herein to Hall elements having a particular shape (e.g., rectangular or square). One of ordinary skill in the art will appreciate, however, that the techniques described herein are applicable to a variety of sizes and shapes.

It should be noted that reference is sometimes made herein to Hall elements that have four electrical contacts. In other embodiments, there can be more than four or fewer than four contacts.

Figure 1:
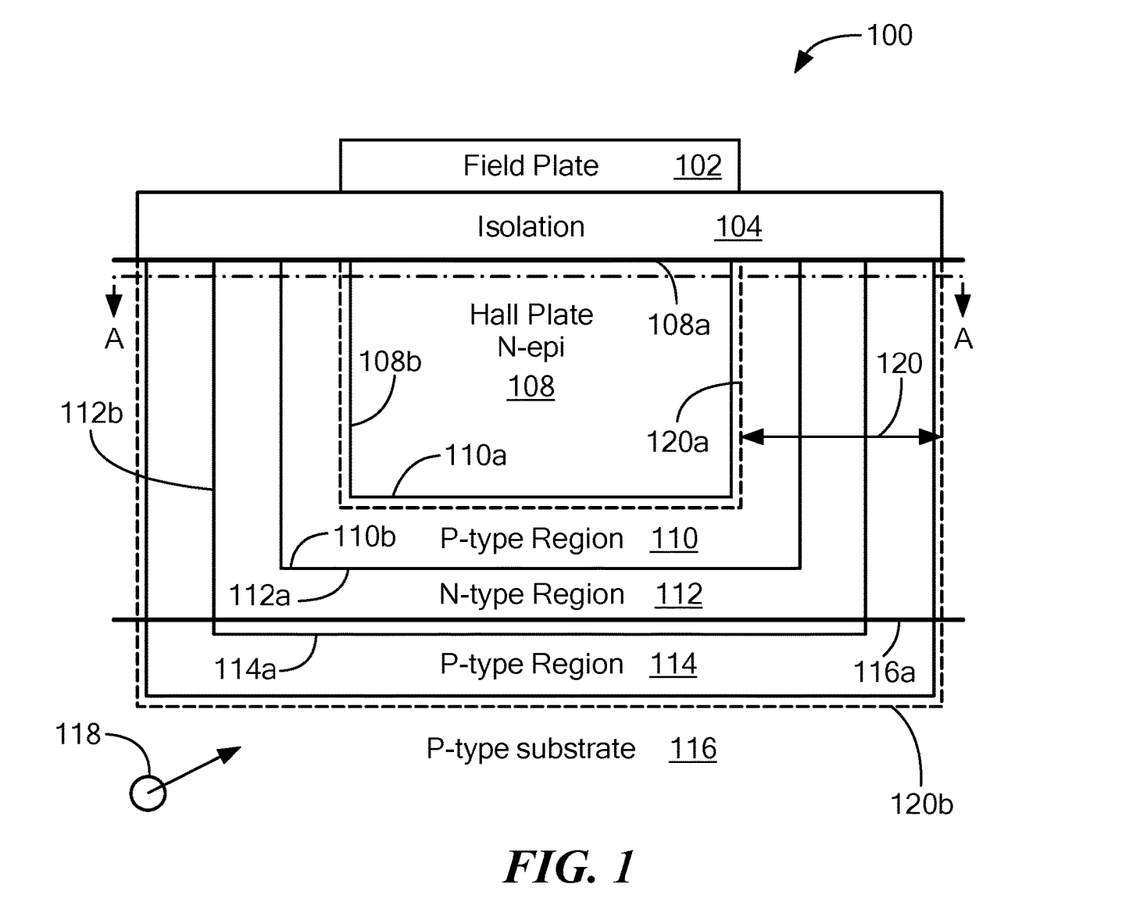
FIG. 1 is a block diagram showing a generalized side view of an illustrative embodiment of a planar Hall effect element.

Referring now to FIG. 1, an illustrative planar Hall effect element 100 can be formed upon or can include a P-type substrate 116. The planar Hall effect element 100 can include a Hall plate region 108 having a first portion 108 of an N-type layer disposed over the P-type substrate 116 having a substrate surface 116a. The first portion 108 of the N-type layer can include a top surface 108a distal from the P-type substrate 116 and a continuous N-type outer boundary 108b intersecting the top surface 108a of the Hall plate region 108. The planar Hall effect element 100 can further include an isolation region 120 having a continuous outer boundary 120b and having a continuous inner boundary 120a, the continuous inner boundary 120a in contact with all of the outer boundary 108b of the Hall plate region 108. The P-type substrate 116 and the first portion 108 of the N-type layer do not form a P/N junction subject to charge flow.

In some embodiments, the first portion 108 of the N-type layer can be comprised of a first portion 108 of an N-type epi layer.

The isolation region 120 can include a first P-type region 110 having a continuous outer boundary 110b and having a continuous inner boundary 110a, the continuous inner boundary 110a in contact with all of the outer boundary 108b of the Hall plate region. The isolation region 120 can further include an N-type region 112 having a continuous outer boundary 112b and having a continuous inner boundary 112a, the continuous inner boundary 112a in contact with all of the continuous outer boundary 110b of the first P-type region 110. The isolation region 120 can further include a second P-type region 114 having a continuous inner boundary 114a in contact with all of the outer boundary 112b of the N-type region 112.

An isolation layer 104 can be disposed over the N-epi region 106. A field plate 102 can be disposed over the isolation layer 104, and can be a part of a metal layer. Vias and electrical couplings to the Hall effect 100 are not shown, but will be understood.

It should be understood that the planar Hall effect element 100 is shown only in a general form and can indicate that a minority carrier charge 118 in the substrate, which may be generated by EMI of the environment, is not able to flow to reach the Hall plate region 108 Instead, minority carriers can be collected by the N-type region 112 instead of the Hall plate region 108. In some embodiments, the N-type region 112 can be connected to a low impedance supply voltage, e.g., VCC or an output of a voltage regulator. Thus, though the minority carriers, e.g., 118, may still flow, e.g., due to EMI, EMI induced current does not affect the Hall effect sensor 106.

In other words, the P-type substrate 116 and the first portion 108 of the N-type layer (i.e., the Hall plate region 108) do not form a P/N junction through which charge can flow. Essentially, the N-type region 112 and the first P-type region 110 form a reverse direction diode.

The isolation region 120 forms a charge barrier not allowing charges to flow between the P-type substrate 116 and the Hall plate region 108 for voltages across the isolation region 120 less than a breakdown voltage.

Figure 4:
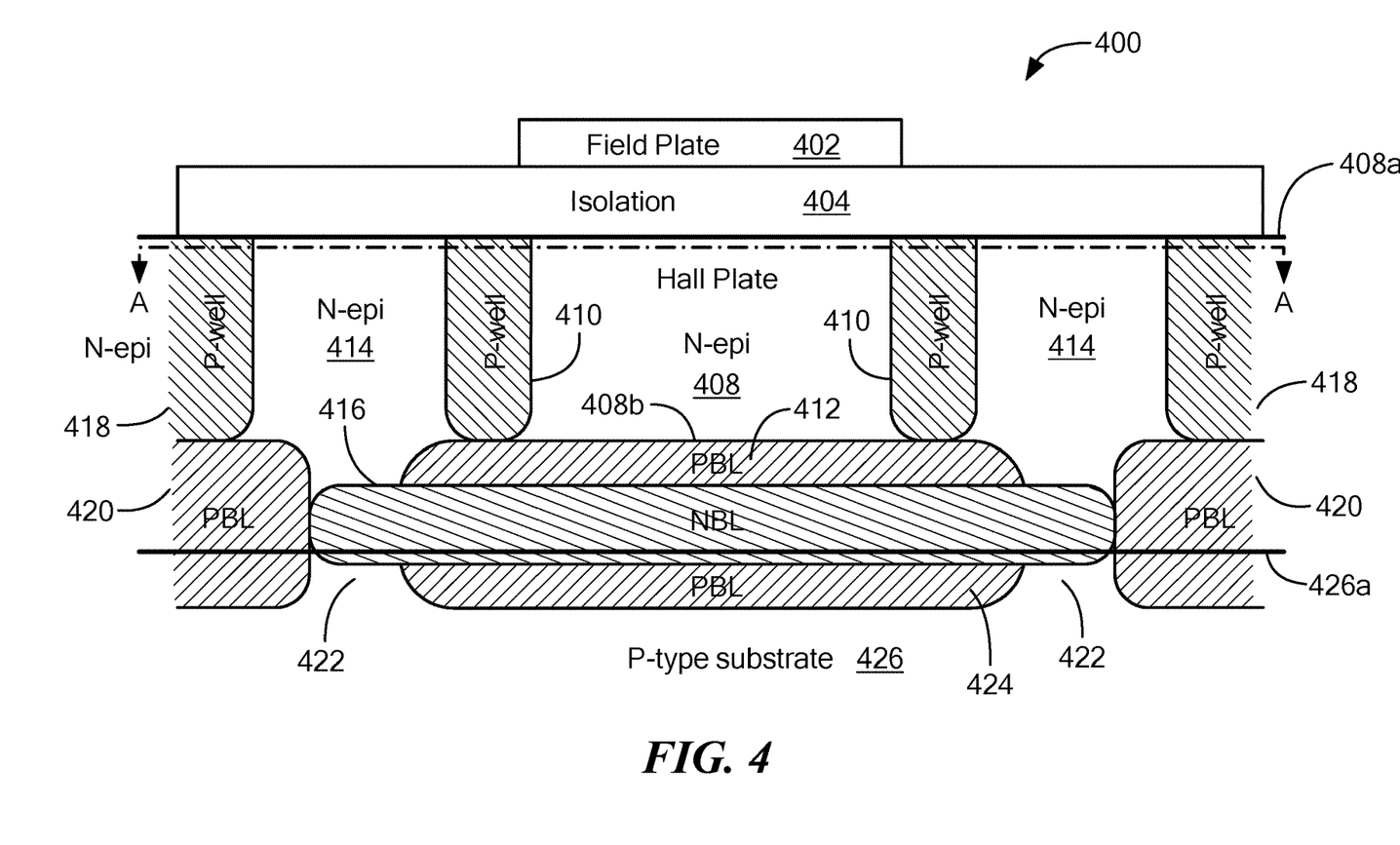
FIG. 4 is a block diagram showing a more detailed side view of an illustrative embodiment of a planar Hall effect element in accordance with FIG. 1.

An illustrative more detailed embodiment of the generalized planar Hall effect element is shown below in conjunction with FIG. 4.

Figure 2:
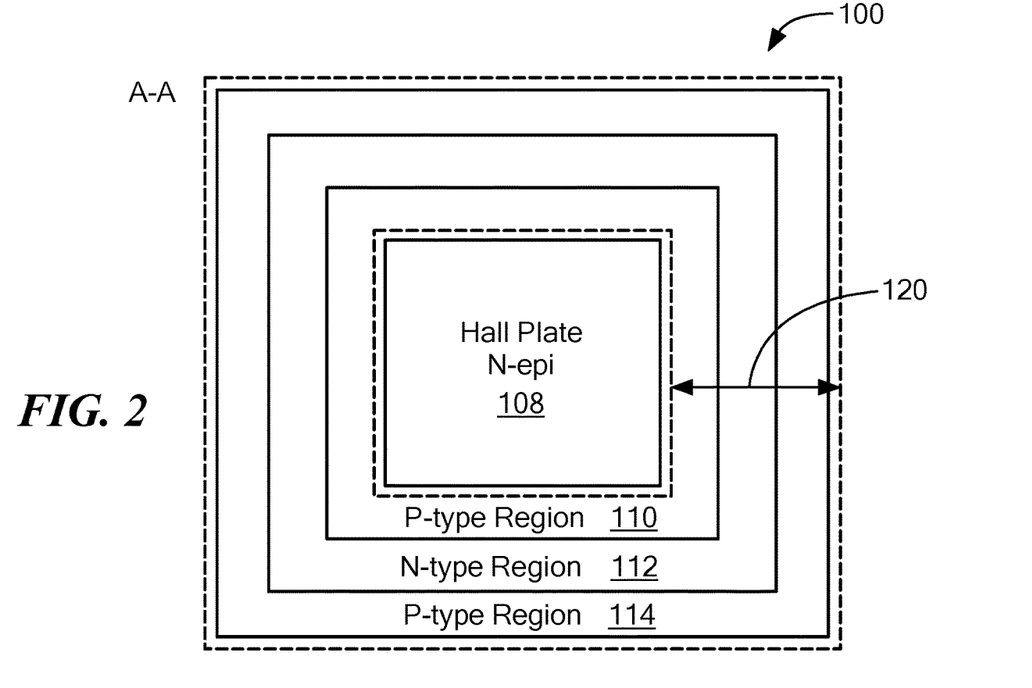
FIG. 2 is a top view cross section view showing an embodiment of the planar Hall effect element of FIG. 1.

Referring now to FIG. 2, in which like elements of FIG. 1 are shown having like reference designations, the planar Hall effect element 100 is shown in a top view cross section along section line A-A of FIG. 1. From FIGS. 1 and 2, it should be understood that the Hall plate 108 can be surrounded by the isolation region 120, including the first P-type-region 110, the N-type region, and the second P-type regions.

The Hall plate 108 can be square or rectangular from the top view. The first P-type region 110, the N-type region 112, and the second P-type region 114 can also be square or rectangular.

Figure 3:
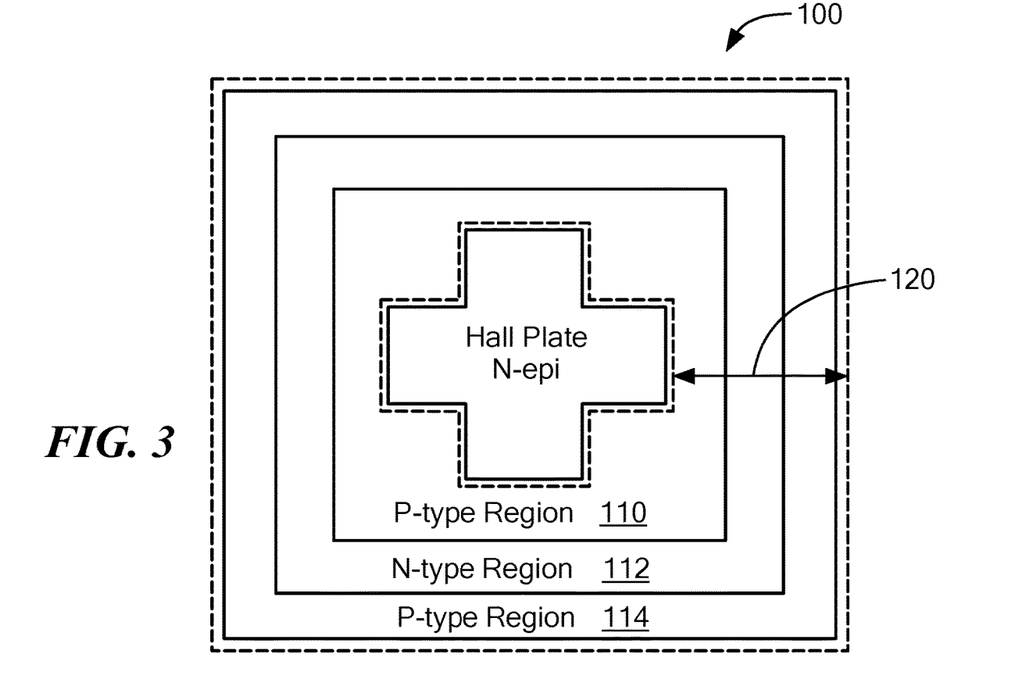
FIG. 3 is a top view cross section view showing another embodiment of the planar Hall effect element of FIG. 1.

Referring now to FIG. 3, in which like elements of FIG. 1 are shown having like reference designations, the planar Hall effect element 100 is shown in a top view cross section along section line A-A of FIG. 1. From FIGS. 1 and 2, it should be understood that the Hall plate region 108 can be surrounded by the isolation region 120, including the first P-type-region 110, the N-type region 112, and the second P-type region 114.

The Hall plate region 108 can be cross shaped from the top view. The first P-type region 110, the N-type region 112, and the second P-type region 114 can be square or rectangular. However, in an alternate embodiment (not shown), one or more of the first P-type region 110, the N-type region 112, or the second P-type region 114 can also be cross shaped.

An example of a cross shaped planar Hall effect element, but without the first P-type region 110, the N-type region 112, or all of the second P-type region 114 can be found, in U.S. Pat. No. 8,357,983, issued Jan. 22, 2013, which is assigned to the assignee of the present invention, and which is incorporated by reference herein in its entirety.

It is understood that planar Hall effect elements having other shapes are also possible (e.g., circular, octagonal, etc.). More than four pickup contacts are also possible.

Referring now to FIG. 4, and referring again to FIG. 1, a planar Hall effect element 400 can be similar to the planar Hall effect element 100.

A P-type substrate 426 can have a surface 426a. The first T-type region 110 can include a first P-well region 410 and a first PBL region 412 coupled to the first P-well region 410. The N-type 112 region can include a second portion 414 of the N-type epi layer 408 and an NBL region 416 coupled to the second portion 414 of the N-type epi layer 408. The second P-type region 114 can include a second P-well region 418, a second PBL region 420 coupled to the second P-well region 418, and a third PBL region 424 proximate to the second PBL region 420. In some embodiments, the second T-type region 114 can also include a portion 422 of the P-type substrate 426.

In some embodiments, the planar Hall effect element 400 can be formed in the following way:
1) form NBL region 416 upon the P-type substrate 426 (in some embodiments, the NBL region can be gridded);
2) apply heat and to diffuse NBL region 416 downward into P-type substrate 426;
2) form PBL regions upon the P-type substrate 426;
3) apply heat to diffuse PBL regions 420, 412 into P-type substrate 426, and downward through NBL region 416 to become PBL region 424;
4) form N-type epi layer (e.g., N-type epi layer portions 414, 408) over substrate;
5) form P-well regions over N-type epi layer; and
6) Apply heat to diffuse P-well regions 410, 418 downward into N-type epi layer so that P-well region 410 contacts PBL region 412, and P-well region 418 contacts PBL region 420, and also to further diffuse the NBL region 416 upward into portions of the N-type epi layer 408, 414 and downward into P-type substrate 426, and also to further diffuse the PBL regions 420, 412, upward into the portions of the N-type epi layer 408, 414, and also to further diffuse the PBL region 424 downward into P-type substrate 426.

Starting as one NBL region 416 under the PBL region 412 and over the P-type substrate 426 at above enumerated 1 and 3, the PBL region 412 can diffuse through and become both under and over the NBL region 416 in the following example fabrication technique.

The NBL region 416 can be formed with an antimony implant followed by a high temperature diffusion. Similarly, the PBL region 412 can be formed with a boron implant and diffusion. Afterwards, the N-type epitaxial region (e.g., portions 414, 408) is grown. The PBL region 412 and the NBL region 416 diffuse into the epitaxial layer (e.g., portions 414, 408) during successive high temperature steps through the fabrication process. The higher boron diffusion coefficient allows the PBL region 412 to extend further upward and downward (becoming the PBL region 424) than the NBL region 416.

Figure 5:
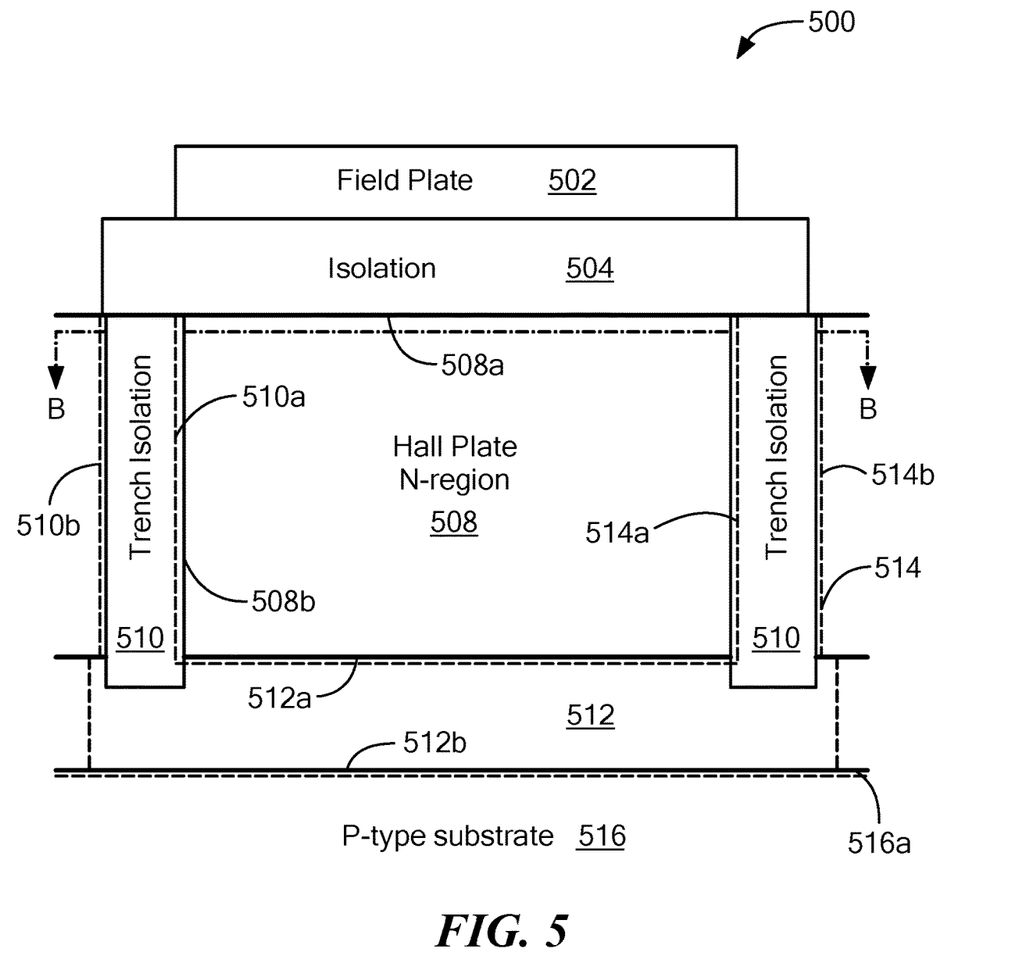
FIG. 5 is a block diagram showing a detailed side view of another illustrative embodiment of a planar Hall effect element.

Referring now to FIG. 5, another illustrative planar Hall effect element 500 can be formed upon or can include a P-type substrate 516. The planar Hall effect element 500 can include a Hall plate region 508. The Hall plate region 508 can include a first portion 508 of an N-type layer. The first portion 508 of the N-type layer can include a top surface 508a distal from the P-type substrate 516, and a continuous N-type outer boundary 508b intersecting the top surface 508a of the Hall plate region 508. The planar Hall effect element 500 can further include an isolation region 514 having a continuous outer boundary 514b and having a continuous inner boundary 514a, the continuous inner boundary 514a in contact with all of the outer boundary 508b of the Hall plate region 508. The P-type substrate 516 and the first portion 508 of the N-type layer do not form a P/N junction subject to charge flow.

In some embodiments, the first portion 508 of the N-type layer can be comprised of a first portion 508 of an N-type epi layer.

The isolation region 514 can include a trench isolation region 510 disposed proximate to the first portion 508 of the N-type region, i.e., proximate to the Hall plate region 508. The isolation region 514 can also include an oxide layer 512 disposed under the Hall plate region 508 and in contact with the trench isolation region 510, wherein the trench isolation region 510 and the oxide layer 512 taken together form the continuous inner boundary 514a of the isolation region 514.

It should be recognized that any charge flowing in the P-type substrate, e.g., charge due to EMI, cannot reach the Hall plate region 508.

In other words, the P-type substrate 516 and the first portion 508 of the N-type layer (i.e., the Hall plate region 508) do not form a P/N junction through which charge can flow.

The isolation region 514 forms a charge barrier not allowing charges to flow between the P-type substrate 516 and the Hall plate region 508 for voltages across the isolation region 516 less than a breakdown voltage.

Figure 6:
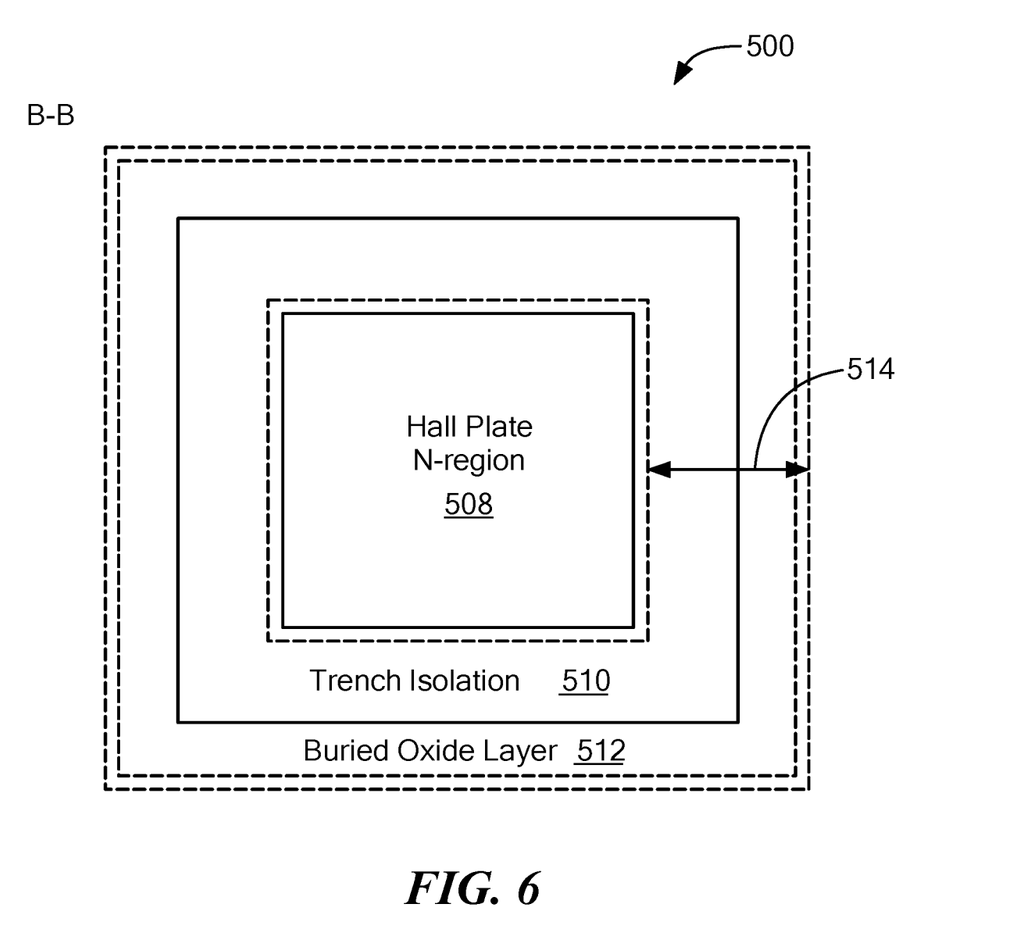
FIG. 6 is a top view cross section showing the planar Hall effect element of FIG. 5.

Referring now to FIG. 6, in which like elements of FIG. 5 are shown having like reference designations, the planar Hall effect element 500 is shown in a top view cross section along section line B-B of FIG. 5. From FIGS. 5 and 6, it should be understood that the Hall plate region 508 can be surrounded by the isolation region 514, including the trench isolation region 510 and the oxide layer 512.

The Hall plate region 508 can be square or rectangular from the top view. The isolation region 514, including the trench isolation region 510 and the oxide layer 512, can also be square or rectangular.

Referring briefly to FIG. 3, it will be understood that in other embodiments, a planar Hall effect element similar to the planar Hall effect element 500 can have a Hall plate region and/or other regions that can be cross shaped or another shape.

While particular types of isolation regions 120, 514 are shown in conjunction with figurers herein, it should be understood that other types of isolation regions can be formed that entirely surround a Hall plate region of a planar Hall element. The other types of isolation regions can have a similar advantage, i.e., to stop charges that may be induced by EMI from flowing into the Hall plate region.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A planar Hall effect element, comprising:
   a P-type substrate;
   a Hall plate region comprising:
   a first portion of an N-type epi layer disposed above the P-type substrate, the first portion of the N-type epi layer comprising:
      a top surface distal from the P-type substrate; and
      a continuous N-type outer boundary intersecting the top surface of the Hall plate region,
   an isolation region configured to isolate the P-type substrate from the Hall plate region, the isolation region having a continuous outer boundary and having a continuous inner boundary, the continuous inner boundary in contact with all of the outer boundary of the Hall plate region, the P-type substrate and the first portion of the N-type epi layer not forming a P/N junction;
   a field plate comprised of a portion of metal disposed over the N-type epi layer; and
   an isolation layer between the N-type epi layer and the field plate, wherein the isolation layer is in direct contact with the isolation region,
   wherein the isolation region comprises:
      a first P-type region having a continuous outer boundary and having a continuous inner boundary, the continuous inner boundary in contact with all of the outer boundary of the Hall plate region;
      an N-type region having a continuous outer boundary and having a continuous inner boundary, the continuous inner boundary in contact with all of the continuous outer boundary of the first P-type region; and
      a second P-type region having a continuous inner boundary in contact with all of the outer boundary of the N-type region.

2. The planar Hall element of claim 1, wherein the first P-type region comprises a first one or more P-type diffusions, wherein the N-type region comprises one or more N-type diffusions, and wherein the second P-type region comprises a second one or more P-type diffusions.

3. The planar Hall element of claim 1, wherein the first P-type region comprises a first P-well region and a first PBL region coupled to the first P-well region, wherein the N-type region comprises a second portion of the N-type epi layer and an NBL region coupled to the second portion of the N-type epi layer, and wherein the second P-type region comprises a second P-well region, a second PBL region coupled to the second P-well region, and a third PBL region proximate to the second PBL region.

4. The planar Hall element of claim 3, wherein the second P-well region extends into the P-type substrate, and wherein the third PBL region extends into the P-type substrate.

5. The planar Hall element of claim 3, wherein the second P-type region further comprises a diffusion into the P-type substrate between the second PBL region and the third PBL region.

6. The planar Hall element of claim 1, wherein the top surface of the Hall plate region has a square shape.

7. The planar Hall element of claim 1, wherein the top surface of the Hall plate region has a cross shape.

8. The planar Hall element of claim 2, wherein the top surface of the Hall plate region has a square shape.

9. The planar Hall element of claim 2, wherein the top surface of the Hall plate region has a cross shape.

10. The planar Hall effect element of claim 1, wherein the isolation region forms a charge barrier not allowing charges to flow between the P-type substrate and the Hall plate region for voltages across the isolation region less than a breakdown voltage.

11. The planar Hall element of claim 1, wherein the field plate continuously extends from at least a first side of the Hall plate region to at least a second side of the Hall plate region.

12. The planar Hall element of claim 1, wherein the isolation layer continuously extends from at least a first side of the isolation region to at least a second side of the isolation region opposite the first side of the isolation region.

13. The planar Hall element of claim 1, wherein the isolation layer is in direct contact with the N-type epi layer and the field plate.

14. The planar Hall element of claim 1, wherein the isolation layer continuously extending from at least a first side of the Hall plate region to at least a second side of the Hall plate region opposite the first side of the Hall plate region.

15. A method of forming a planar Hall effect element, comprising:
  providing a P-type substrate;
  forming a Hall plate region comprising:
    forming a first portion of an N-type epi layer disposed above the P-type region, the first portion of the N-type epi layer comprising:
      a top surface distal from the P-type substrate; and
      a continuous N-type outer boundary intersecting the top surface of the Hall plate region,
    forming an isolation region configured to isolate the P-type substrate from the Hall plate region, the isolation region having a continuous outer boundary and having a continuous inner boundary, the continuous inner boundary in contact with all of the outer boundary of the Hall plate region, the P-type substrate and the first portion of the N-type epi layer not forming a P/N junction;
    forming a field plate comprised of a portion of metal over the N-type epi layer; and
    forming an isolation layer between the N-type epi layer and the field plate, wherein the isolation layer is in direct contact with the isolation region,
  wherein the forming the isolation region comprises:
    forming a first P-type region having a continuous outer boundary and having a continuous inner boundary, the continuous inner boundary in contact with all of the outer boundary of the Hall plate region;
    forming an N-type region having a continuous outer boundary and having a continuous inner boundary, the continuous inner boundary in contact with all of the continuous outer boundary of the first P-type region; and
    forming a second P-type region having a continuous inner boundary in contact with all of the outer boundary of the N-type region.

16. The method of claim 15, wherein the first P-type region comprises a first one or more P-type diffusions, wherein the N-type region comprises one or more N-type diffusions, and wherein the second P-type region comprises a second one or more P-type diffusions.

17. The method of claim 15, wherein the first P-type region comprises a first P-well region and a first PBL region coupled to the first P-well region, wherein the N-type region comprises a second portion of the N-type epi layer and an NBL region coupled to the second portion of the N-type epi layer, and wherein the second P-type region comprises a second P-well region, a second PBL region coupled to the second P-well region, and a third PBL region proximate to the second PBL region.

18. The method of claim 17, wherein the second P-well region extends into the P-type substrate, and wherein the third PBL region extends into the P-type substrate.

19. The method of claim 17, wherein the second P-type region further comprises a diffusion into the P-type substrate between the second PLB region and the third PBL region.

20. The method of claim 15, wherein the top surface of the Hall plate region has a square shape.

21. The method of claim 16, wherein the top surface of the Hall plate region has a cross shape.

22. The method of claim 16, wherein the top surface of the Hall plate region has a square shape.

23. The method of claim 15, wherein the top surface of the Hall plate region has a cross shape.

24. The method of claim 15, wherein the isolation region forms a charge barrier not allowing charges to flow between the P-type substrate and the Hall plate region for voltages across the isolation region less than a breakdown voltage.

25. A planar Hall effect element, comprising:
  a P-type substrate;
  means for forming a Hall plate region comprising:
    means for forming a first portion of an N-type epi layer disposed above the P-type substrate, the first portion of the N-type epi layer comprising:
      a top surface distal from the P-type substrate; and
      a continuous N-type outer boundary intersecting the top surface of the Hall plate region,
    means for forming an isolation region configured to isolate the P-type substrate from the Hall plate region, the isolation region having a continuous outer boundary and having a continuous inner boundary, the continuous inner boundary in contact with all of the outer boundary of the Hall plate region, the P-type substrate and the first portion of the N-type epi layer not forming a P/N junction;
    means for forming a field plate comprised of a portion of metal over the N-type epi layer; and
    means for forming an isolation layer between the N-type epi layer and the field plate, wherein the isolation layer is in direct contact with the isolation region,
  wherein the N-type epi layer having a portion of the top surface of the N-type layer distal from the substrate, wherein the means for forming the isolation region comprises:
    means for forming a first P-type region having a continuous outer boundary and having a continuous inner boundary, the continuous inner boundary in contact with all of the outer boundary of the Hall plate region;

means for forming an N-type region having a continuous outer boundary and having a continuous inner boundary, the continuous inner boundary in contact with all of the continuous outer boundary of the first P-type region; and means for forming a second P-type region having a continuous inner boundary in contact with all of the outer boundary of the N-type region.

26. The planar Hall element of claim 25, wherein the first P-type region comprises a first one or more P-type diffusions, wherein the N-type region comprises one or more N-type diffusions, and wherein the second P-type region comprises a second one or more P-type diffusions.

27. The planar Hall element of claim 25, wherein the first P-type region comprises a first P-well region and a first PBL region coupled to the first P-well region, wherein the N-type region comprises a second portion of the N-type epi layer and an NBL region coupled to the second portion of the N-type epi layer, and wherein the second P-type region comprises a second P-well region, a second PBL region coupled to the second P-well region, and a third PBL region proximate to the second PBL region.

28. The planar Hall element of claim 27, wherein the second P-well region extends into the P-type substrate, and wherein the third PBL region extends into the P-type substrate.

29. The planar Hall element of claim 27, wherein the second P-type region further comprises a diffusion into the P-type substrate between the second PLB region and the third PBL region.

30. The planar Hall element of claim 25, wherein the top surface of the Hall plate region has a square shape.

31. The planar Hall element of claim 26, wherein the top surface of the Hall plate region has a cross shape.

32. The planar Hall element of claim 26, wherein the top surface of the Hall plate region has a square shape.

33. The planar Hall element of claim 25, wherein the top surface of the Hall plate region has a cross shape.

34. The planar Hall effect element of claim 25, wherein the isolation region forms a charge barrier not allowing charges to flow between the P-type substrate and the Hall plate region for voltages across the isolation region less than a breakdown voltage.

* * * * *

UNITED STATES PATENT AND TRADEMARK OFFICE
CERTIFICATE OF CORRECTION

PATENT NO. : 10,608,168 B2
APPLICATION NO. : 15/724576
DATED : March 31, 2020
INVENTOR(S) : Juan Manuel Cesaretti et al.

It is certified that error appears in the above-identified patent and that said Letters Patent is hereby corrected as shown below:

In the Specification

Column 1, Line 27, delete "and" and replace with --an--.

Column 1, Line 44, delete "he" and replace with --be--.

Column 1, Line 49, delete "the another portion" and replace with --another portion--.

Column 2, Line 9, delete "the from" and replace with --from--.

Signed and Sealed this
Tenth Day of November, 2020

Andrei Iancu
*Director of the United States Patent and Trademark Office*